United States Patent
Han

(10) Patent No.: US 10,074,711 B2
(45) Date of Patent: Sep. 11, 2018

(54) AMOLED DISPLAY DEVICE

(71) Applicant: Shenzhen China Star Optoelectronics Technology Co., Ltd., Shenzhen (CN)

(72) Inventor: Baixiang Han, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 101 days.

(21) Appl. No.: 15/328,491

(22) PCT Filed: Dec. 16, 2016

(86) PCT No.: PCT/CN2016/110245
§ 371 (c)(1),
(2) Date: Jan. 24, 2017

(87) PCT Pub. No.: WO2018/045658
PCT Pub. Date: Mar. 15, 2018

(65) Prior Publication Data
US 2018/0219056 A1  Aug. 2, 2018

(30) Foreign Application Priority Data

Sep. 9, 2016  (CN) .......................... 2016 1 0819118

(51) Int. Cl.
*H01L 27/32* (2006.01)
*H01L 51/52* (2006.01)
*H01L 51/50* (2006.01)

(52) U.S. Cl.
CPC ...... *H01L 27/3276* (2013.01); *H01L 51/5012* (2013.01); *H01L 51/5056* (2013.01);
(Continued)

(58) Field of Classification Search
CPC ............. H01L 27/3276; H01L 51/5072; H01L 51/5092; H01L 51/5056; H01L 51/5221; H01L 51/5218; H01L 51/5012
See application file for complete search history.

(56) References Cited

U.S. PATENT DOCUMENTS

| 2013/0203197 | A1* | 8/2013 | Tsai | ........................ H01L 51/56 438/35 |
| 2016/0064421 | A1* | 3/2016 | Oh | ...................... H01L 27/1222 257/43 |

* cited by examiner

*Primary Examiner* — Tom Thomas
*Assistant Examiner* — Benjamin Tzu-Hung Liu
(74) *Attorney, Agent, or Firm* — Leong C. Lei

(57) ABSTRACT

The present invention provides an AMOLED display device, which includes a cathode connection layer formed on a backing plate and provides connection between the cathode and the cathode connection layer through a via formed in and through structural layers thereof so that in a normal displaying operation of the AMOLED display device, an electrical current signal is conducted through the cathode connection layer to a cathode, achieving transmission of the electrical current signal through an interior of each pixel to the cathode, and making a conduction path of the electrical current signal shortened as compared to a conventional AMOLED display device and reducing electrical resistance of the conduction path of the electrical current signal, thereby lowering IR drop of a display circuit and helping improve displaying performance and power loss of the AMOLED display device. Further, since the cathode connection layer is disposed on the backing plate and the connection between the cathode and the cathode connection layer requires only one via, no much space of pixel arrangement will be occupied and thus no significant influence will be imposed on the entire pixel arrangement of the AMOLED display device.

16 Claims, 4 Drawing Sheets

(52) U.S. Cl.
CPC ...... *H01L 51/5072* (2013.01); *H01L 51/5092* (2013.01); *H01L 51/5218* (2013.01); *H01L 51/5221* (2013.01)

AMOLED DISPLAY DEVICE

BACKGROUND OF THE INVENTION

1. Field of the Invention

The present invention relates to the field of display technology, and more particular to an active matrix organic light-emitting diode (AMOLED) display device.

2. The Related Arts

Organic light-emitting diode (OLED) displays, which are also referred to organic electroluminescent displays, are a newly emerging flat panel display device and possess advantages, such as being self-luminous, low drive voltage, high luminous brightness, short response time, high clarity and contrast, almost 180° view angle, wide range of operation temperature, and easy realization of flexible displaying and large-area full-color displaying, and are considered the most promising display devices.

Based on the way of driving, OLEDs can be classified in two categories, passive matrix OLED (PMOLED) and active matrix OLED (AMOLED), namely one for direct addressing, and the other for TFT array addressing, among which, the AMOLED comprises pixels that are arranged in an array and belongs to an active display type, having high light emission performance and being commonly used in high definition large-sized display devices.

An OLED is generally made up of a substrate, an anode arranged on the substrate, a hole injection layer arranged on and anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of an OLED display device is that when a semiconductor material and an organic light emission material are driven by an electric field, carrier currents are injected and re-combine to cause emission of light. Specifically, the OLED display device often uses an indium tin oxide (ITO) pixel electrode and a metal electrode to respectively serve as the anode and cathode of the device and electrons and holes, when driven by a predetermined electrical voltage, are respectively injected into the electron transport layer and the hole transport layer such that the electrons and the holes respectively migrate through the electron transport layer and the hole transport layer to get into the emissive layer and meet in the emissive layer to form excitons that excites light emissive molecules to emit light, the later undergoing radiation relaxation to give off visible light.

FIG. 1 is a schematic view illustrating the structure of a conventional AMOLED display device. The AMOLED display device comprises a backing plate 100, a gate electrode 200 disposed on the backing plate 100, a gate insulation layer 300 disposed on the gate electrode 200 and the backing plate 100, an active layer 400 disposed on the gate insulation layer 300 and corresponding to the gate electrode 200, an etch stop layer 500 disposed on the active layer 400 and the gate insulation layer 300, a source electrode 610 and a drain electrode 620 disposed on the etch stop layer 500, a first planarization layer 710 disposed on the source electrode 610, the drain electrode 620, and the etch stop layer 500, an anode 800 disposed on the first planarization layer 710 and connected with the drain electrode 620, a second planarization layer 720 disposed on the anode 800 and the first planarization layer 710, an emissive layer 900 disposed in a via 725 formed in the second planarization layer 720, and a cathode 910 disposed on the emissive layer 900 and the second planarization layer 720. In such an AMOLED display device, the cathode 910 covers an entire surface of an entire display zone of the AMOLED display device and has a relatively large size. In a normal displaying operation of such an AMOLED display device, an electrical current signal must be conducted from a point in an edge of the cathode 910 to a center and other area of the cathode 910 so that the conduction path is relatively long. Further, the cathode 910 is generally a metal electrode having a relatively small thickness and thus has a relatively large resistance so that when the conduction path of the electrical current signal is relatively long, it is ready to cause IR drop in the entire display circuit. In other words, an electrical voltage that is actually transmitted to the cathode 910 is lower than a voltage set for it so that the display performance would be poor and power loss would be large.

To cope with such a problem, a solution that is currently adopted is proposed as shown in FIG. 2, in which a cathode connection line is included in the interior of the AMOLED display device. The cathode connection line comprises a metal block 630 that is arranged on the same layer as the source electrode 610 and the drain electrode 620. The first planarization layer 710 and the second planarization layer 720 that are located between the cathode 910 and the metal block 630 is provided therein with a via 750, so that the cathode 910 and the metal block 630 are connected to each other through the via 750. Such a cathode connection line allows an external electrical current signal to be transmitted, in the interior of each pixel, from the metal block 630 to the cathode 910, avoiding conduction of the electrical current signal from an edge of the cathode 910 to a center thereof so as to shorten the conduction path of the electrical current signal. In addition, the metal block 630 is often made of a material having a relatively low resistance and has an enlarged thickness so that the metal block 630 exhibits a relatively lower resistance, making the overall resistance of the display circuit reduced thereby reducing IR drop and thus improving display performance and loss of electrical power. However, such a measure still suffers a shortcoming, namely the metal block 630, which is arranged in the interior of each pixel, occupying a part of space for pixel arrangement thereby causing influence on the overall pixel arrangement of the AMOLED display device.

SUMMARY OF THE INVENTION

An objective of the present invention is to provide an active matrix organic light-emitting diode (AMOLED) display device, which helps lower down IR drop in a display circuit, without affecting overall pixel arrangement of the AMOLED display device.

To achieve the above objective, the present invention provides an AMOLED display device, which comprises: a backing plate, a cathode connection layer disposed on the backing plate, a buffer layer disposed on the cathode connection layer, a gate electrode disposed on the buffer layer, a gate insulation layer disposed on the gate electrode and the buffer layer, an active layer disposed on the gate insulation layer and located above and corresponding to the gate electrode, an etch stop layer disposed on the active layer and the gate insulation layer, a first via and a second via formed in the etch stop layer and respectively corresponding to two opposite ends of the active layer, a source electrode and a drain electrode disposed on the etch stop layer and respectively in connection with the active layer through the first via and the second via, a first planarization layer disposed on the source electrode, the drain electrode, and the etch stop layer, a third via formed in the first planarization layer and corresponding to the drain electrode, an anode disposed on the first planarization layer and in connection with the drain electrode through the third via, a second planarization layer disposed on the anode and the first planarization layer, a fourth via formed in the second planarization layer and corresponding to the anode, an emissive layer disposed in the fourth via and in connection with the anode, and a cathode disposed on the emissive layer and the second planarization layer;

wherein a fifth via is formed in the buffer layer, the gate insulation layer, the etch stop layer, the first planarization layer, and the second planarization layer, and the cathode is in connection with the cathode connection layer through the fifth via.

Each pixel associated with each emissive layer is provided with a fifth via.

The cathode connection layer comprises an entire-sheet metal layer that is continuous without interruption therein or a metal layer comprising hollowed portions therein; and the cathode connection layer has a size that is less than or substantially equal to a size of the backing plate.

The cathode connection layer comprises a material comprising at least one of silver, aluminum, copper, and gold.

The cathode connection layer has a thickness of 0.3 µm-1 µm.

The cathode comprises an entire-sheet metal layer that is continuous without interruption therein and the cathode has a size covering an entire display area of the AMOLED display device.

The cathode comprises a composite metal layer formed of a magnesium layer and an aluminum layer stacked on each other, or a single metal layer formed of a magnesium aluminum alloy.

The cathode has a thickness of 100 nm-200 nm.

The anode is a reflective electrode.

In a preferred embodiment of the present invention, the AMOLED display device further comprises an electrostatic discharge metal block, wherein the electrostatic discharge metal block is arranged on the same layer as the source electrode and the drain electrode and the buffer layer, the gate insulation layer, and the etch stop layer are provided with a sixth via formed therein and the electrostatic discharge metal block is connected with the cathode connection layer through the sixth via.

The present invention also provides an AMOLED display device, which comprises: a backing plate, a cathode connection layer disposed on the backing plate, a buffer layer disposed on the cathode connection layer, a gate electrode disposed on the buffer layer, a gate insulation layer disposed on the gate electrode and the buffer layer, an active layer disposed on the gate insulation layer and located above and corresponding to the gate electrode, an etch stop layer disposed on the active layer and the gate insulation layer, a first via and a second via formed in the etch stop layer and respectively corresponding to two opposite ends of the active layer, a source electrode and a drain electrode disposed on the etch stop layer and respectively in connection with the active layer through the first via and the second via, a first planarization layer disposed on the source electrode, the drain electrode, and the etch stop layer, a third via formed in the first planarization layer and corresponding to the drain electrode, an anode disposed on the first planarization layer and in connection with the drain electrode through the third via, a second planarization layer disposed on the anode and the first planarization layer, a fourth via formed in the second planarization layer and corresponding to the anode, an emissive layer disposed in the fourth via and in connection with the anode, and a cathode disposed on the emissive layer and the second planarization layer;

wherein a fifth via is formed in the buffer layer, the gate insulation layer, the etch stop layer, the first planarization layer, and the second planarization layer, and the cathode is in connection with the cathode connection layer through the fifth via;

wherein the cathode connection layer comprises a material comprising at least one of silver, aluminum, copper, and gold;

wherein the cathode connection layer has a thickness of 0.3 µm-1 µm;

wherein the cathode comprises a composite metal layer formed of a magnesium layer and an aluminum layer stacked on each other, or a single metal layer formed of a magnesium aluminum alloy; and wherein the cathode has a thickness of 100 nm-200 nm.

The efficacy of the present invention is that the present invention provides an AMOLED display device, which comprises a cathode connection layer formed on a backing plate and provides connection between the cathode and the cathode connection layer through a via formed in and through structural layers thereof so that in a normal displaying operation of the AMOLED display device, an electrical current signal is conducted through the cathode connection layer to a cathode, achieving transmission of the electrical current signal through an interior of each pixel to the cathode, and making a conduction path of the electrical current signal shortened as compared to a conventional AMOLED display device and reducing electrical resistance of the conduction path of the electrical current signal, thereby lowering IR drop of a display circuit and helping improve displaying performance and power loss of the AMOLED display device. Further, since the cathode connection layer is disposed on the backing plate and the connection between the cathode and the cathode connection layer requires only one via, no much space of pixel arrangement will be occupied and thus no significant influence will be imposed on the entire pixel arrangement of the AMOLED display device.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
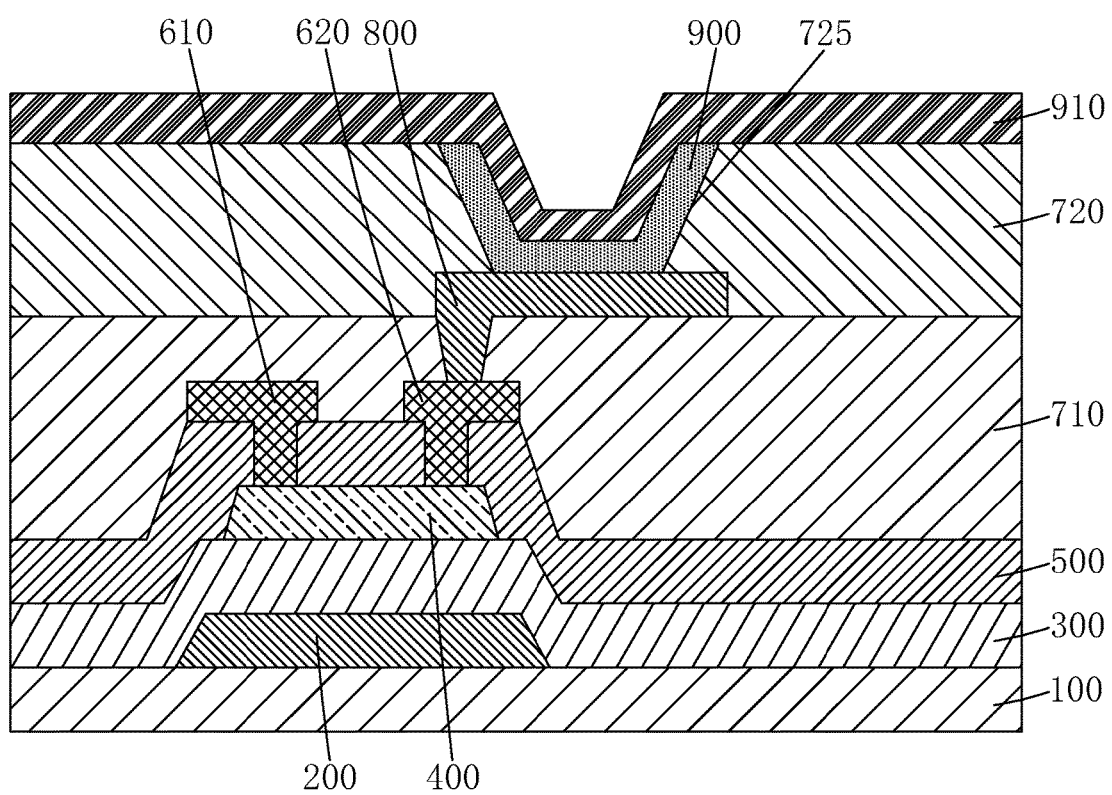
FIG. 1 is a schematic view illustrating the structure of a conventional active matrix organic light-emitting diode (AMOLED) display device.
Figure 2:
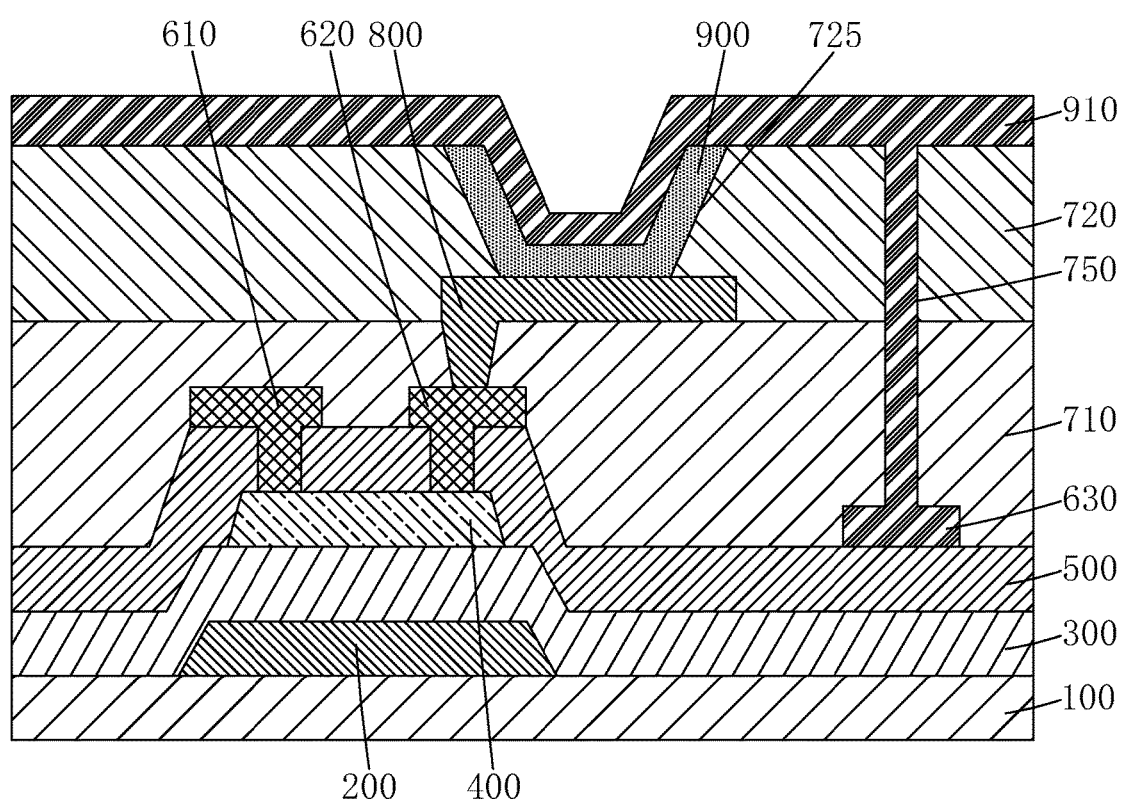
FIG. 2 is a schematic view illustrating the structure of another conventional AMOLED display device.
Figure 3:
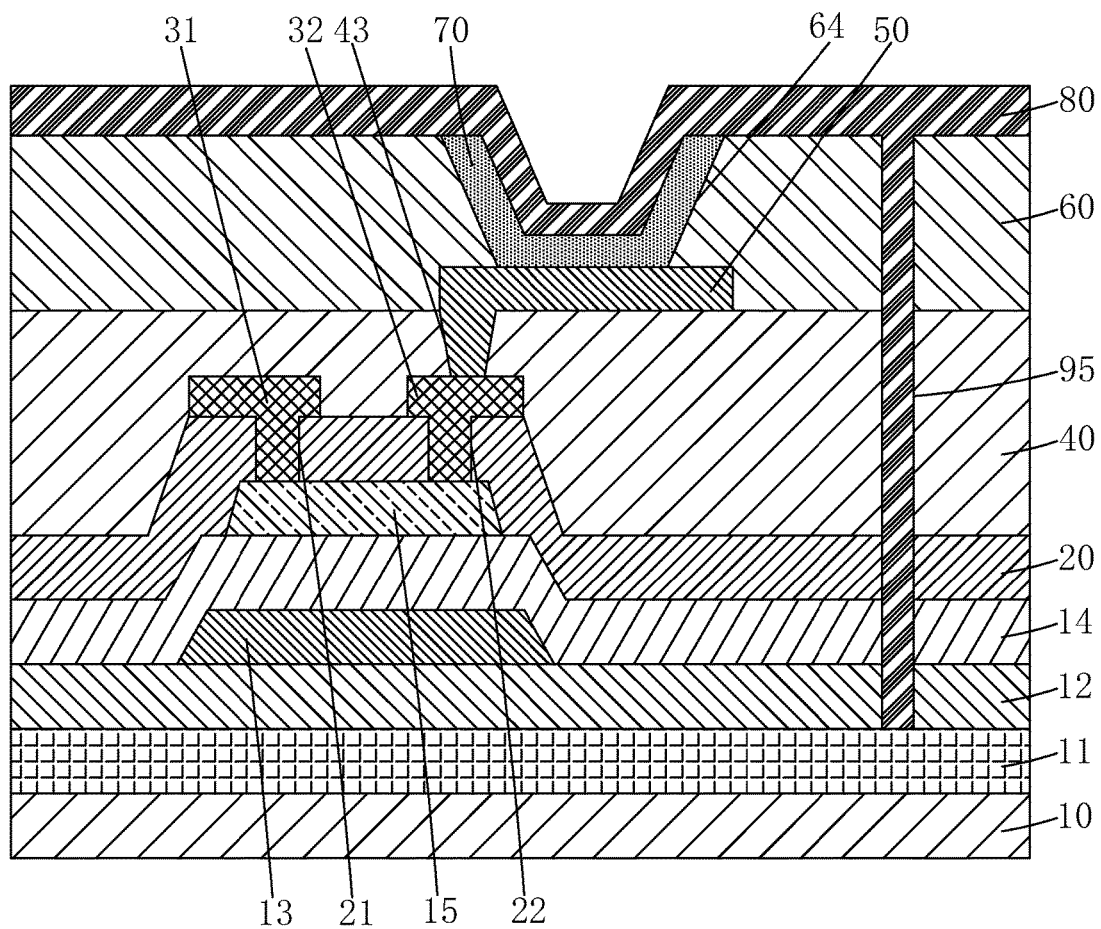
FIG. 3 is a schematic view illustrating the structure of a first embodiment of an AMOLED display device according to the present invention.

Referring to FIG. 3, the present invention provides an active matrix organic light-emitting diode (AMOLED) display device, which comprises: a backing plate 10, a cathode connection layer 11 disposed on the backing plate 10, a buffer layer 12 disposed on the cathode connection layer 11, a gate electrode 13 disposed on the buffer layer 12, a gate insulation layer 14 disposed on the gate electrode 13 and the buffer layer 12, an active layer 15 disposed on the gate insulation layer 14 and located above and corresponding to the gate electrode 13, an etch stop layer 20 disposed on the active layer 15 and the gate insulation layer 14, a first via 21 and a second via 22 formed in the etch stop layer 20 and respectively corresponding to two opposite ends of the active layer 15, a source electrode 31 and a drain electrode 32 disposed on the etch stop layer 20 and respectively in connection with the active layer 15 through the first via 21 and the second via 22, a first planarization layer 40 disposed on the source electrode 31, the drain electrode 32, and the etch stop layer 20, a third via 43 formed in the first planarization layer 40 and corresponding to the drain electrode 32, an anode 50 disposed on the first planarization layer 40 and in connection with the drain electrode 32 through the third via 43, a second planarization layer 60 disposed on the anode 50 and the first planarization layer 40, a fourth via 64 formed in the second planarization layer 60 and corresponding to the anode 50, an emissive layer 70 disposed in the fourth via 64 and in connection with the anode 50, and a cathode 80 disposed on the emissive layer 70 and the second planarization layer 60.

A fifth via 95 is formed in the buffer layer 12, the gate insulation layer 14, the etch stop layer 20, the first planarization layer 40, and the second planarization layer 60, and the cathode 80 is in connection with the cathode connection layer 11 through the fifth via 95.

Specifically, in the AMOLED display device, each pixel associated with each emissive layer 70 is provided with a fifth via, so that an electrical current signal can be transmitted from an interior of each pixel to the cathode 80, whereby a conduction path of the electrical current signal for transmission from the cathode connection layer 11 to the cathode 80 in each pixel is made consistent and is shortened with respect to the conventional electrical current conduction paths, so as to help reduce IR drop in the entire display circuit.

Specifically, the cathode connection layer 11 comprises an entire-sheet metal layer that is continuous without interruption therein or a metal layer comprising hollowed portions therein. The cathode connection layer 11 has a size that is less than or substantially equal to a size of the backing plate 10.

Specifically, the cathode connection layer 11 comprises a material having an electrically conductive material having a low electrical resistance; and preferably, the cathode connection layer 11 comprises a material comprising at least one of silver (Ag), aluminum (Al), copper (Cu), and gold (Au).

Specifically, the cathode connection layer 11 has a thickness of 0.3 μm-1 μm, preferably 0.5 μm, and the greater the thickness of the cathode connection layer 11, the lower the electrical resistance of the cathode connection layer 11.

Specifically, the cathode 80 comprises an entire-sheet metal layer that is continuous without interruption therein and the cathode 80 has a size covering an entire display area of the AMOLED display device, meaning the emissive layers 70 of multiple pixels sharing the same cathode 80.

Specifically, the cathode 80 comprises a composite metal layer formed of a magnesium layer and an aluminum layer stacked on each other, or a single metal layer formed of a magnesium aluminum alloy.

Specifically, the cathode 80 has a thickness of 100 nm-200 nm, preferably 100 nm.

Specifically, the AMOLED display device according to the present invention is a top emission display device, namely the side thereof associated with the cathode 80 being a light emission side, so that the inclusion of the cathode connection layer 11 does not affect displaying performed by the AMOLED display device.

Further, since the AMOLED display device of the present invention is a top emission display device, the anode 50 is a reflective electrode; and preferably, the anode 50 comprises a composite layer comprising two indium tin oxide (ITO) layers interposing a silver (Ag) layer therebetween.

Figure 4:
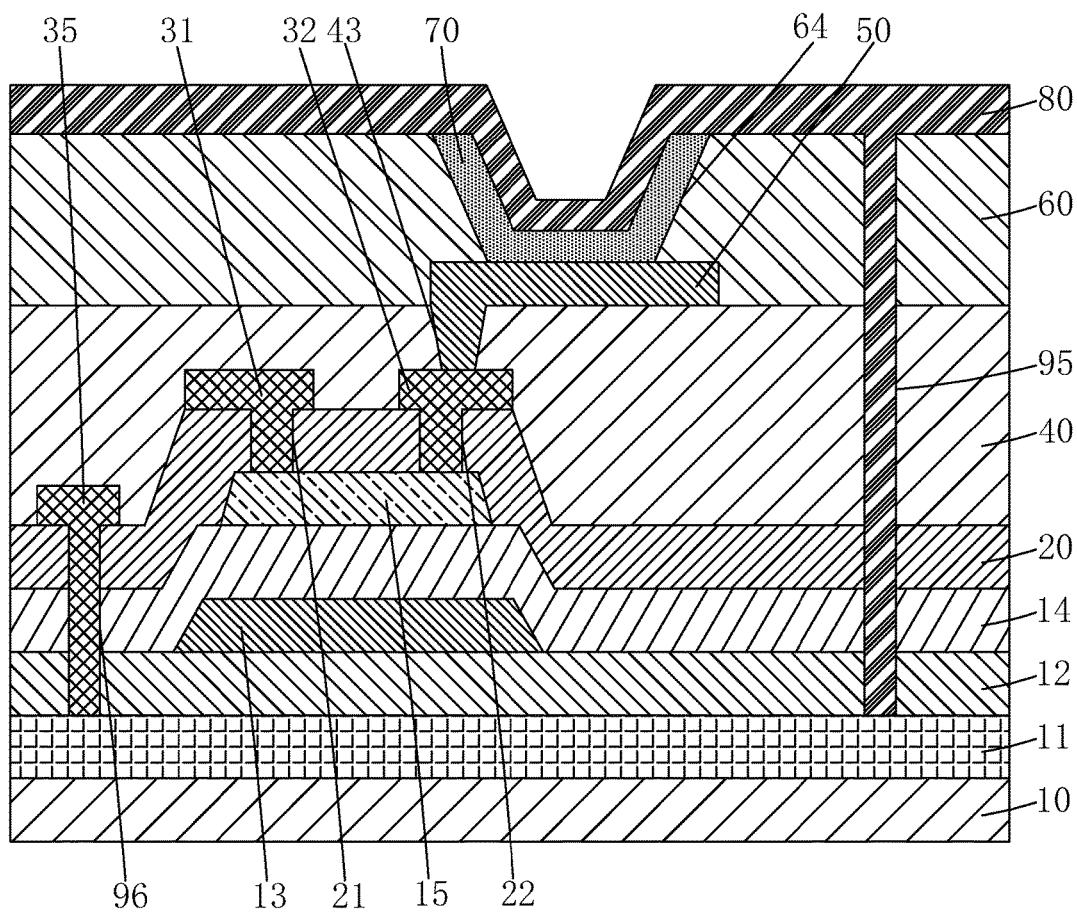
FIG. 4 is a schematic view illustrating the structure of a second embodiment of the AMOLED display device according to the present invention.

Referring to FIG. 4, a second embodiment of the AMOLED display device according to the present invention is shown. In this embodiment, the AMOLED display device further comprises an electrostatic discharge metal block 35. The electrostatic discharge metal block 35 is arranged on the same layer as the source electrode 31 and the drain electrode 32. The buffer layer 12, the gate insulation layer 14, and the etch stop layer 20 are provided with a sixth via 96 formed therein and the electrostatic discharge metal block 35 is connected with the cathode connection layer 11 through the sixth via 96 so as to conduct static charges accumulated in the electrostatic discharge metal block 35 to the cathode connection layer 11 that has a relatively large area to be discharged from the cathode connection layer 11.

Specifically, the backing plate 10 comprises a glass plate or a plastic plate.

The gate electrode 13, the source electrode 31, the drain electrode 32, and the electrostatic discharge metal block 35 each comprise a material that is metals, preferably at least one of molybdenum (Mo), aluminum (Al), copper (Cu), and titanium (Ti).

The buffer layer 12, the gate insulation layer 14, and the etch stop layer 20 each comprise a material that comprises at least one of silicon oxide (SiOx) and silicon nitride (SiNx).

The active layer 15 comprises a material that comprises at least one of amorphous silicon, polysilicon, and metal oxide semiconductors.

The first planarization layer 40 and the second planarization layer 60 comprise a material that is an organic insulation material.

The emissive layer 70 comprises a material that is an organic light emission material.

In summary, the present invention provides an AMOLED display device, which comprises a cathode connection layer formed on a backing plate and provides connection between the cathode and the cathode connection layer through a via formed in and through structural layers thereof so that in a normal displaying operation of the AMOLED display device, an electrical current signal is conducted through the cathode connection layer to a cathode, achieving transmission of the electrical current signal through an interior of each pixel to the cathode, and making a conduction path of the electrical current signal shortened as compared to a conventional AMOLED display device and reducing electrical resistance of the conduction path of the electrical current signal, thereby lowering IR drop of a display circuit and helping improve displaying performance and power loss of the AMOLED display device. Further, since the cathode connection layer is disposed on the backing plate and the connection between the cathode and the cathode connection layer requires only one via, no much space of pixel arrangement will be occupied and thus no significant influence will be imposed on the entire pixel arrangement of the AMOLED display device.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. An active matrix organic light-emitting diode (AMOLED) display device, comprising: a backing plate, a cathode connection layer disposed on the backing plate, a buffer layer disposed on the cathode connection layer, a gate electrode disposed on the buffer layer, a gate insulation layer disposed on the gate electrode and the buffer layer, an active layer disposed on the gate insulation layer and located above and corresponding to the gate electrode, an etch stop layer disposed on the active layer and the gate insulation layer, a first via and a second via formed in the etch stop layer and respectively corresponding to two opposite ends of the active layer, a source electrode and a drain electrode disposed on the etch stop layer and respectively in connection with the active layer through the first via and the second via, a first planarization layer disposed on the source electrode, the drain electrode, and the etch stop layer, a third via formed in the first planarization layer and corresponding to the drain electrode, an anode disposed on the first planarization layer and in connection with the drain electrode through the third via, a second planarization layer disposed on the anode and the first planarization layer, a fourth via formed in the second planarization layer and corresponding to the anode, an emissive layer disposed in the fourth via and in connection with the anode, and a cathode disposed on the emissive layer and the second planarization layer;
wherein a fifth via is formed in the buffer layer, the gate insulation layer, the etch stop layer, the first planarization layer, and the second planarization layer, and the cathode is in connection with the cathode connection layer through the fifth via.

2. The AMOLED display device as claimed in claim 1, wherein each pixel associated with each emissive layer is provided with a fifth via.

3. The AMOLED display device as claimed in claim 1, wherein the cathode connection layer comprises an entire-sheet metal layer that is continuous without interruption therein or a metal layer comprising hollowed portions therein; and the cathode connection layer has a size that is less than or substantially equal to a size of the backing plate.

4. The AMOLED display device as claimed in claim 1, wherein the cathode connection layer comprises a material comprising at least one of silver, aluminum, copper, and gold.

5. The AMOLED display device as claimed in claim 1, wherein the cathode connection layer has a thickness of 0.3 µm-1 µm.

6. The AMOLED display device as claimed in claim 1, wherein the cathode comprises an entire-sheet metal layer that is continuous without interruption therein and the cathode has a size covering an entire display area of the AMOLED display device.

7. The AMOLED display device as claimed in claim 1, wherein the cathode comprises a composite metal layer formed of a magnesium layer and an aluminum layer stacked on each other, or a single metal layer formed of a magnesium aluminum alloy.

8. The AMOLED display device as claimed in claim 1, wherein the cathode has a thickness of 100 nm-200 nm.

9. The AMOLED display device as claimed in claim 1, wherein the anode is a reflective electrode.

10. The AMOLED display device as claimed in claim 1 further comprising an electrostatic discharge metal block, wherein the electrostatic discharge metal block is arranged on the same layer as the source electrode and the drain electrode and the buffer layer, the gate insulation layer, and the etch stop layer are provided with a sixth via formed therein and the electrostatic discharge metal block is connected with the cathode connection layer through the sixth via.

11. An active matrix organic light-emitting diode (AMOLED) display device, comprising: a backing plate, a cathode connection layer disposed on the backing plate, a buffer layer disposed on the cathode connection layer, a gate electrode disposed on the buffer layer, a gate insulation layer disposed on the gate electrode and the buffer layer, an active layer disposed on the gate insulation layer and located above and corresponding to the gate electrode, an etch stop layer disposed on the active layer and the gate insulation layer, a first via and a second via formed in the etch stop layer and respectively corresponding to two opposite ends of the active layer, a source electrode and a drain electrode disposed on the etch stop layer and respectively in connection with the active layer through the first via and the second via, a first planarization layer disposed on the source electrode, the drain electrode, and the etch stop layer, a third via formed in the first planarization layer and corresponding to the drain electrode, an anode disposed on the first planarization layer and in connection with the drain electrode through the third via, a second planarization layer disposed on the anode and the first planarization layer, a fourth via formed in the second planarization layer and corresponding to the anode, an emissive layer disposed in the fourth via and in connection with the anode, and a cathode disposed on the emissive layer and the second planarization layer;
wherein a fifth via is formed in the buffer layer, the gate insulation layer, the etch stop layer, the first planarization layer, and the second planarization layer, and the cathode is in connection with the cathode connection layer through the fifth via;
wherein the cathode connection layer comprises a material comprising at least one of silver, aluminum, copper, and gold;
wherein the cathode connection layer has a thickness of 0.3 µm-1 µm;
wherein the cathode comprises a composite metal layer formed of a magnesium layer and an aluminum layer stacked on each other, or a single metal layer formed of a magnesium aluminum alloy; and
wherein the cathode has a thickness of 100 nm-200 nm.

12. The AMOLED display device as claimed in claim 11, wherein each pixel associated with each emissive layer is provided with a fifth via.

13. The AMOLED display device as claimed in claim 11, wherein the cathode connection layer comprises an entire-sheet metal layer that is continuous without interruption therein or a metal layer comprising hollowed portions therein; and the cathode connection layer has a size that is less than or substantially equal to a size of the backing plate.

14. The AMOLED display device as claimed in claim 11, wherein the cathode comprises an entire-sheet metal layer that is continuous without interruption therein and the cathode has a size covering an entire display area of the AMOLED display device.

15. The AMOLED display device as claimed in claim 11, wherein the anode is a reflective electrode.

16. The AMOLED display device as claimed in claim 11 further comprising an electrostatic discharge metal block, wherein the electrostatic discharge metal block is arranged on the same layer as the source electrode and the drain electrode and the buffer layer, the gate insulation layer, and the etch stop layer are provided with a sixth via formed therein and the electrostatic discharge metal block is connected with the cathode connection layer through the sixth via.

* * * * *